United States Patent [19]

Nagasaka et al.

[11] Patent Number: 4,640,737
[45] Date of Patent: Feb. 3, 1987

[54] DRY ETCHING METHOD OF COMPOUND SEMICONDUCTOR

[75] Inventors: Hiroko Nagasaka, Yokohama; Nawoto Motegi, Kanagawa, both of Japan

[73] Assignee: Kabushiki Kaisha Toshiba, Kawasaki, Japan

[21] Appl. No.: 664,965

[22] Filed: Oct. 26, 1984

[30] Foreign Application Priority Data

Nov. 30, 1983 [JP] Japan ................. 58-224077

[51] Int. Cl.$^4$ ............ H01L 21/306; B44C 1/22; C03C 15/00; C03C 25/06
[52] U.S. Cl. .................... 156/643; 156/646; 156/659.1; 156/662; 156/345; 204/192.32; 252/79.1
[58] Field of Search ........... 156/643, 646, 652, 655, 156/659.1, 662, 345; 252/79.1; 204/164, 192 E, 192 EC, 298; 427/38, 39; 430/313; 29/569 L, 580; 357/17, 22, 55

[56] References Cited

U.S. PATENT DOCUMENTS 4,403,241 9/1983 Butherus .................. 357/55
4,426,246 1/1984 Kravitz et al. ............ 252/79.1 X

FOREIGN PATENT DOCUMENTS 3132555 6/1982 Fed. Rep. of Germany .

OTHER PUBLICATIONS

Proceeding of Int. Electron. Devices Meeting, Washington, D.C., Dec., (1976), 205; R. G. Poulsen et al.
Japanese Journal of Applied Physics, vol. 22, No. 10 (1983), L653; K. Asakawa et al.
Proceeding of Symposium on Dry Process (1982), 79; H. Nagasaka et al.
Processings of the International Symposium on Gallium Arsenide and Related Compounds, Vienna, AT, 22nd–24th 9/1980, pp. 267–273, The Institute of Physics, Bristol/London, GB; L. A. D'Asaro et al: "Plasma-Etched via Connections to GaAs FET's" *p. 268, paragraph 6–p. 269, paragraph 6*.
Patents Abstracts of Japan, vol. 7, No. 258 (E-211) [1403], 17th 11/1983; & JP—A—58 143 530 (Tokyo Shibaura Denki K.K.) 26-08-1983.
Extended Abstracts, vol. 83-1, May 1983, p. 546, Pennington, N.J., US; D. L. Flamm: "Plasma Etching of III-V Compounds" *paragraph 1,2*.
Solid State Technology, vol. 25, No. 4, Apr. 1982, pp. 160–165, Port Washington, N.Y. US; R. F. Reichelderfer: "Single Wafer Plasma Etching" *p. 160, col. 1, paragraph 3—col. 2, paragraph 2; p. 161, col. 2, paragraph 2—p. 163, col. 1, paragraph 2*.

Primary Examiner—William A. Powell
Attorney, Agent, or Firm—Oblon, Fisher, Spivak, McClelland, & Maier

[57] ABSTRACT

A compound semiconductor is dry-etched by introducing a plasma-generating gas comprising boron trichloride and chlorine into a plasma generation region which is defined between a cathode for supporting a workpiece comprising a compound semiconductor and an anode opposite thereto. High-frequency electric power is applied between the cathode and the anode, thereby generating a plasma from the introduced plasma-generating gas. The compound semiconductor is etched with the thus formed plasma.

13 Claims, 15 Drawing Figures

F I G. 6
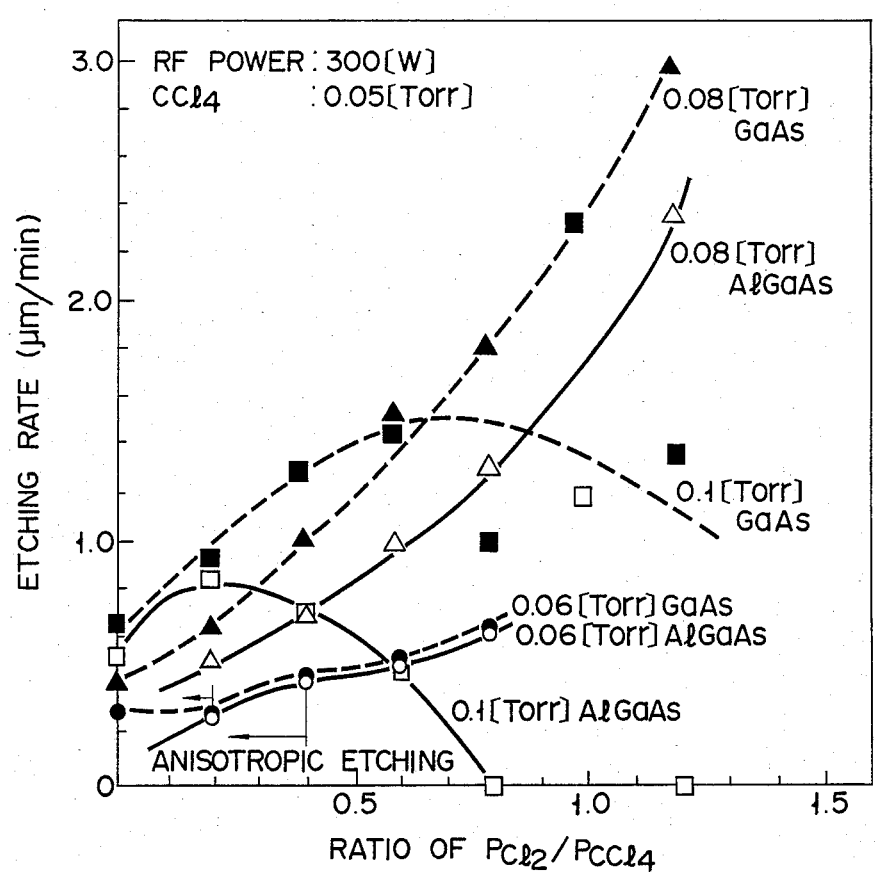

DRY ETCHING METHOD OF COMPOUND SEMICONDUCTOR

BACKGROUND OF THE INVENTION

1. Field of the Invention

The present invention relates to a dry etching method of a III-V Group compound semiconductor, more particularly, to a dry etching method of such a compound semiconductor using a plasma etching apparatus.

2. Description of the Prior Art

A III-V Group compound semiconductor such as gallium arsenide, indium phosphide, or gallium aluminum arsenide is used as a base material of a semiconductor laser, a light-emitting diode or the like. When a substrate of such a compound semiconductor is used, a semiconductor device can be manufactured such as a field effect transistor or an integrated device thereof having a better performance than that of a semiconductor device having a silicon substrate. Furthermore, by using such compound semiconductors, an "optoelectric circuit" has been developed with a new concept in which an electrical integrated circuit and a light emitting/receiving element circuit are integrally formed.

In order to improve the productivity and the reproducibility in the manufacture of semiconductor devices including such compound semiconductor devices, a dry etching method has recently been used in a manufacturing process thereof. Particularly, a reactive ion etching method using a parallel flat plate electrode type device has been suggested as a dry etching process. In this method, a plasma-generating gas containing halogen is introduced to a vacuum pressure of $10^{-2}$ to $10^{-1}$ Torr in a vacuum chamber having an electrode (cathode) to which high-frequency power is applied and a ground electrode (anode) opposite thereto. A material to be etched is placed on the cathode. When the plasma-generating gas is introduced, the high-frequency power is applied to the cathode, thereby generating a glow discharge. Then, the cathode is negatively self-biased by a mobility difference between electrons and ions, and a dark space is formed thereon. A cathode breakdown voltage Vdc is also generated by this self bias. Reactive ions generated by the glow discharge from the plasma-generating gas are accelerated by the cathode breakdown voltage, thereby bombarding the material to be etched. Atoms sputtered by this bombardment react with the reactive ions to generate highly volatile molecules, and the molecules are discharged from the vacuum chamber. Thus, the etching is performed.

In this etching method, the material can be anisotropically etched. Under optimal conditions, a pattern width of about 0.5 to 1 $\mu$m can be obtained. Therefore, a high-density and high-performance semiconductor device can be obtained with this method in comparison to a wet etching method in which an undercut easily occurs and it is difficult to obtain micropatterning. However, although the dry etching method is effective in manufacturing a semiconductor device as described above, it has the problems to be described below when this method is used to etch a compound semiconductor unlike a single semiconductor material such as silicon, or metallic material such as aluminum. So, the dry etching method has not been used practically to etch compound semiconductors.

In a compound semiconductor, since this material consists of a plurality of different types of atoms, conditions for simultaneously etching those plurality of different types of atoms much be selected. Further, etching mechanism of the compound semiconductors is very complicated and is not known to a satisfactory extent.

In a manufacturing process of a semiconductor laser, in order to form an end face of a resonator or a mesa structure, an etching depth of about 5 $\mu$m is required. In comparison to a prior art technique which needs an etching depth of 1 $\mu$m or less, an etching rate and an etching selectivity with respect to a mask must be several times those of the prior art. Therefore, the prior art technique and the conditions thereof cannot be adopted.

$CCl_2F_2$ or $Cl_2$ gas is known as a reactive ion etching gas for GaAs. However, the present inventors confirmed by experiment that a GaAlAs film could not be etched by this gas. On the other hand, when a protection layer which does not contain Al was continuously formed on the GaAlAs crystal surface, the protection layer and the GaAlAs layer could be etched using $Cl_2$ gas. However, such a protection layer adds another requirement for device design, and has an etching rate too low under anisotropic etching conditions. Therefore, such a protection layer cannot be used in a device manufacturing process.

The present inventors experimentally confirmed that when GaAlAs was etched by using $CCl_4$ gas, an etching rate was too low and reproducibility was very poor.

The present inventors also experimentally confirmed that when a GaAlAs layer was etched using a gas mixture of $Cl_2$ and $CCl_4$, it was etched at an etching rate which was suitable for a device manufacturing process. Despite this, the present inventors found that proper etching could not be achieved by using the above-mentioned gas mixture for the following reasons.

(a) Since a proper etching rate can be obtained within a limited etching condition range, the proper etching rate cannot always be achieved due to variations in etching devices or different environmental factors.

(b) This method has poor reproducibility. Since both the $CCl_4$ and $Cl_2$ gases cannot effectively scavenge $H_2O$, $O_2$ and the like, Al reacts with $O_2$ included in an etching atmosphere and $H_2O$ is adsorbed in $AlCl_3$ as a reaction product, resulting in poor evacuation. Therefore, an etching rate and etching characteristics thereof are easily changed by differences in the evacuation condition of $H_2O$, $O_2$ and the like, reaction products, the evacuation efficiency of residues and the temperature of the electrodes.

(c) An etching selectivity ratio of the compound semiconductor with respect to a mask cannot be set at a high value; it is 5 to 10 at most. This results from sputter of a mask since the ion bombardment effect of the gas is too large.

(d) A polymer is formed on a surface of the etching material which is etched. This polymer partially serves as a mask with respect to the surface of the material, thereby blocking etching and complicating removal of this polymer after the etching.

SUMMARY OF THE INVENTION

It is an object of the present invention to provide a dry etching method of a compound semiconductor wherein the above-mentioned disadvantages are considerably reduced.

It is another object of the present invention to provide a dry etching method which has high reproducibility, high etching rate, and good etching selectivity with respect to a mask such as silicon oxide, and which allows anisotropic etching of a compound semiconductor.

According to the present invention, the above objects and other objects which will be apparent from the following detailed description can be achieved by using, as a plasma-generating gas, a gas mixture of boron trichloride ($BCl_3$) and chlorine ($Cl_2$) when a compound semiconductor is etched by reactive ion etching. More specifically, according to the present invention, a plasma-generating gas comprising $BCl_3$ and $Cl_2$ is introduced at a predetermined pressure in a plasma generation region defined by a cathode which supports a workpiece comprising a compound semiconductor, and an anode opposite thereto. Then, high-frequency electric power is applied between the cathode and the anode, thereby generating a plasma from the plasma-generating gas. The compound semiconductor is etched by the generated plasma.

BRIEF DESCRIPTION OF THE DRAWINGS

FIG. 6 is a graph showing the relationship between a partial pressure ratio of $Cl_2$ and carbon tetrachloride ($CCl_4$) and an etching rate when a compound semiconductor is etched using a mixture of $CCl_4$ and $Cl_2$;

DETAILED DESCRIPTION OF THE PREFERRED EMBODIMENT

The present inventors discovered that factors important for etching semiconductor materials such as III–V Group compound semiconductors, particularly those comprising elements such as aluminum which are easily oxidized, are whether or not native oxide formed on a surface of a compound semiconductor can be etched by reactive ions generated from a plasma gas, and whether or not $H_2O$ molecules and $O_2$ in an etching atmosphere can be effectively removed. According to these discoveries, the present inventors have considered various plasma-generating gases and found that $BCl_3$ could be satisfactorily used as a plasma-generating gas to some extent.

This is because the native oxide can be effectively removed by a plasma from $BCl_3$, and boron ions dissociated from the $BCl_3$ react with $H_2O$ molecules to form boron hydroxide and with $O_2$ to form boron trioxide. These reaction products can be effectively evacuated. In fact, it has been reported that $O_2$ contained in a plasma atmosphere in an amount up to 1% can be evacuated to an extent to be negligible after a plasma is generated. Therefore, a reaction between a component of a compound semiconductor such as aluminum, which is easily oxidized, and $O_2$ can be decreased, and adsorption of $H_2O$ by aluminum chloride formed by a reaction between chlorine ions dissociated from the $BCl_3$ and aluminum can also be decreased, thereby considerably improving the reproducibility.

In addition, when the $BCl_3$ is used, no polymer is formed on a surface of a workpiece which is subjected to etching as with $CCl_4$, thereby improving the reproducibility of an etching pattern and simplifying treatment steps after etching.

Furthermore, when $BCl_3$ is used, since bombardment of ions dissociated therefrom on the workpiece is weaker than that of $CCl_4$, an etching rate (etching selectivity ratio) of a compound semiconductor with respect to a mask material such as a photoresist is increased.

In this manner, it is expected that the $BCl_3$ can be effectively used as a plasma-generating gas for reactive ion etching. However, when the $BCl_3$ is used in etching, an etching rate with respect to a compound semiconductor is as low as about 0.01 μm. Therefore, when deep etching is performed, the etching time is undesirably prolonged. The present inventors have made studies into the cause of this low etching rate by $BCl_3$ and found that the $BCl_3$ was dissociated with low efficiency into chlorine ions and chlorine radicals as an effective etchant of a compound semiconductor, and that the disadvantages could be overcome without losing the above-mentioned advantages by adding chlorine gas to the $BCl_3$, thus achieving the present invention.

The present invention will be described in more detail with reference to FIG. 1 hereafter.

Figure 1:
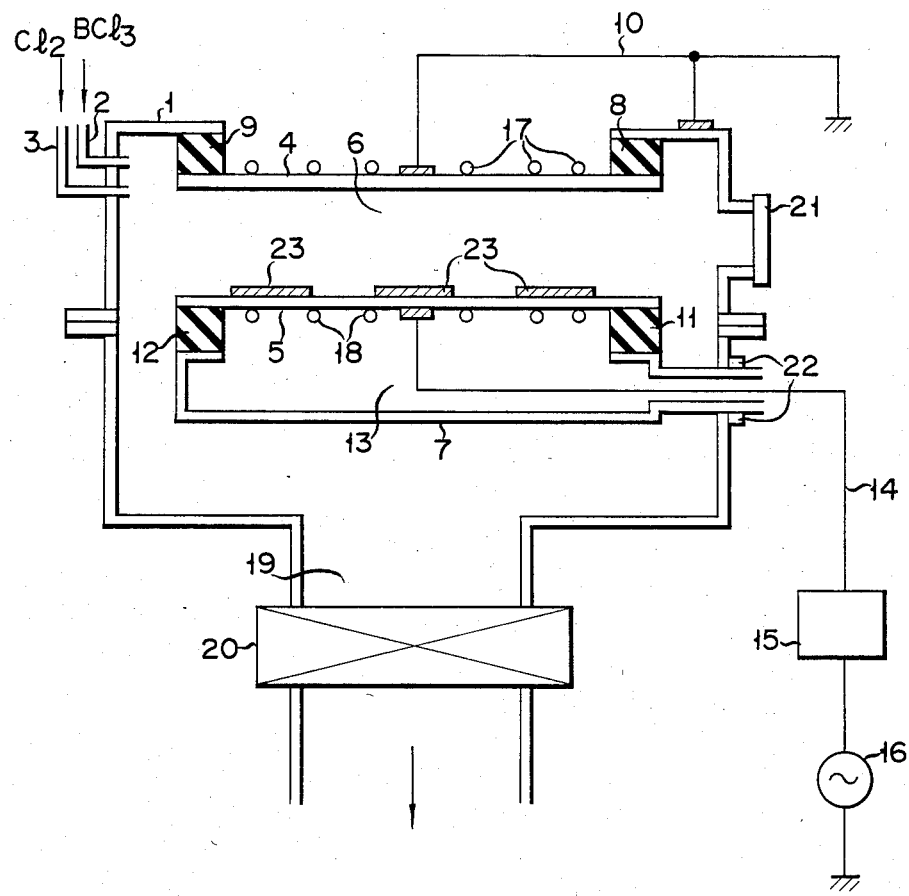
FIG. 1 is a schematic view showing an example of an etching apparatus used in a dry etching method according to an embodiment of the present invention.

FIG. 1 schematically shows an example of an etching apparatus used for performing a dry etching method of the present invention. This apparatus comprises a vaccum chamber 1 made of, for example, stainless steel. The vacuum chamber 1 has inlet ports 2 and 3 for a plasma-generating gas. The vacuum chamber 1 has an observation window 21 at a side opposite to the inlet ports 2 and 3. A flat plate anode 4 which consists of a portion of a wall of the vacuum chamber 1 and a flat plate cathode 5 which is arranged parallel and opposite thereto are disposed in the vacuum chamber 1. A plasma generation region 6 is defined between the anode 4 and the cathode 5.

The anode 4 is insulated from the chamber 1 by insulators 8 and 9 made of, e.g., Teflon and is grounded through a lead 10. The cathode 5 is supported by a supporting plate 7 so as to form a space 13 therebetween. A lead 14 connected to the cathode 5 extends from the space 13 through a vacuum seal 22 and is connected to a high-frequency power source 16 through an impedance matching circuit 15.

In order to radiate heat generated during etching, water cooling pipes 17 and 18 are respectively disposed on and below the anode 4 and the cathode 5.

Futhermore, the vacuum chamber 1 comprises an outlet port 19 having a relatively large diameter. A conductance valve 20 is arranged at the outlet port 19, for controlling the pressure in the vacuum chamber 1. An evacuating means (not shown) such as a diffusion pump, Roots pump, or rotary pump is arranged at a downstream side of the conductance valve 20.

In operation, a plurality of workpieces 23 having at least one III-V group compound semiconductor crystal layer are arranged on the cathode 5. Examples of such III-V Group compound semiconductor to be etched include GaAs, GaAlAs, GaAlAsP, InAlGaP and the like. The dry etching method of the present invention is suitable for etching the III-V Group compound semiconductor containing an element such as aluminum which is easily oxidized.

The pressure in the vacuum chamber 1 is reduced by the evacuating means. The pressure reduced by this preevacuation is preferebly low. For example, after reducing the pressure in the vacuum chamber 1 to 0.000006 Torr or less, $BCl_3$ and $Cl_2$ gases are respectively introduced from the inlet ports 2 and 3. The pressure of the introduced plasma-generating gas is controlled by the conductance valve 20. When anisotropic etching is performed, the total pressure of $BCl_3$ and $Cl_2$ in the vacuum chamber 1 is preferably set to be 0.15 Torr or less, and particularly preferable to be 0.04 to 0.08 Torr. In order to achieve anisotropic etching, the ratio of the $Cl_2$ gas in the introduced plasma-generating gas is set to be 40% by volume or less of the total volume of the plasma gas, and particularly preferable to be 20% by volume or less. This ratio can be easily achieved by controlling the flow rate of the $BCl_3$ and $Cl_2$.

High-frequency electric power is applied to the anode 4 and the cathode 5, while they are cooled by the water cooling pipes 17 and 18. Then, glow discharge occurs between the anode 4 and the cathode 5 (i.e., in the plasma generation region 6), thereby generating a plasma from the introduced plasma-generating gas. An exposed compound semiconductor crystal layer of the workpiece 23 to be etched is etched by the thus generated plasma. An electric power density of the high-frequency electric power applied for generating a plasma is preferably set to be 0.1 W/cm$^2$ to 1 W/cm$^2$, and particularly preferable to be 0.3 W/cm$^2$ to 0.6 W/cm$^2$.

Figure 2:
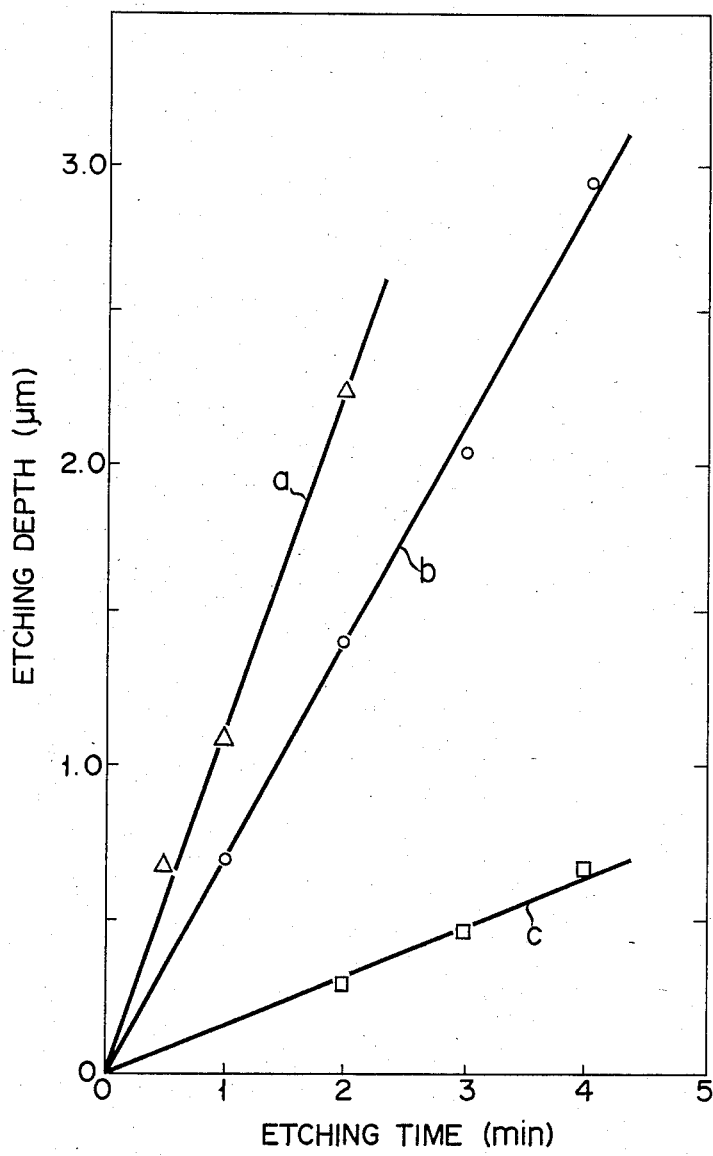
FIGS. 2 and 3 are graphs respectively showing the relationship between an etching time and an etching depth when a compound semiconductor is etched according to the method of the present invention.

FIG. 2 shows the relationship between an etching time and an etching depth, etching rate, when GaAs is etched by the dry etching method of the present invention. The etching conditions were as follows. The high-frequency electric power density was 0.42 W/cm$^2$, the flow rate of the BCl$_3$ introduced into the vacuum chamber 1 was 40 standard cubic centimeters (SCCM), and the flow rate of the introduced Cl$_2$ was 8 SCCM. Under these conditions, when the total pressure of the BCl$_3$ and Cl$_2$ gases was set at 0.15 Torr, the result indicated by the line a was obtained, and when the total pressure was set at 0.06 Torr, the result indicated by the line b was obtained. For the purpose of comparison, when only the BCl$_3$ gas was introduced (at a pressure of 0.06 Torr in the vacuum chamber), the result indicated by the line c was obtained. As is apparent from FIG. 2, in all cases, the etching time and the etching depth show a linear relationship, and etching was performed immediately without a time lag, thus achieving good reproducibility. When the Cl$_2$ gas was added to the BCl$_3$ gas, it was confirmed that etching was performed at an etching rate of five times that of the case wherein only the BCl$_3$ gas was used.

Figure 3:
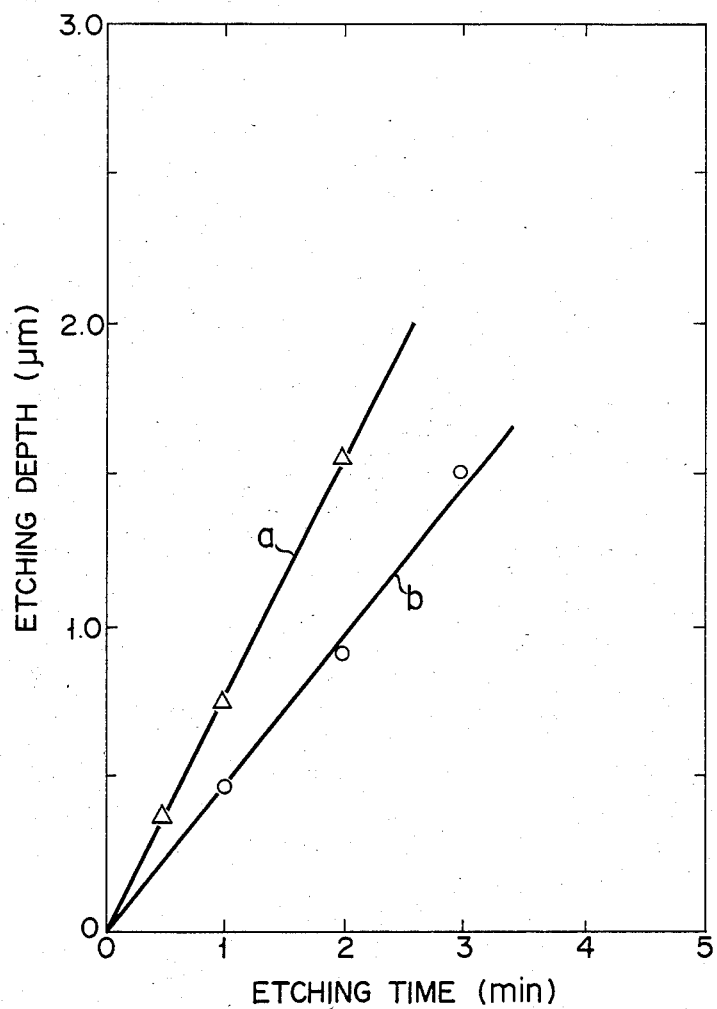

FIG. 3 shows the result when Ga$_{1-x}$Al$_x$As (x=0.45) is etched under the same conditions as those of FIG. 2. The lines a and b indicate the results when the total pressure was set at 0.15 Torr and at 0.06 Torr, respectively. In this case, the graph shows a satisfactory result, as in FIG. 2.

Figure 4:
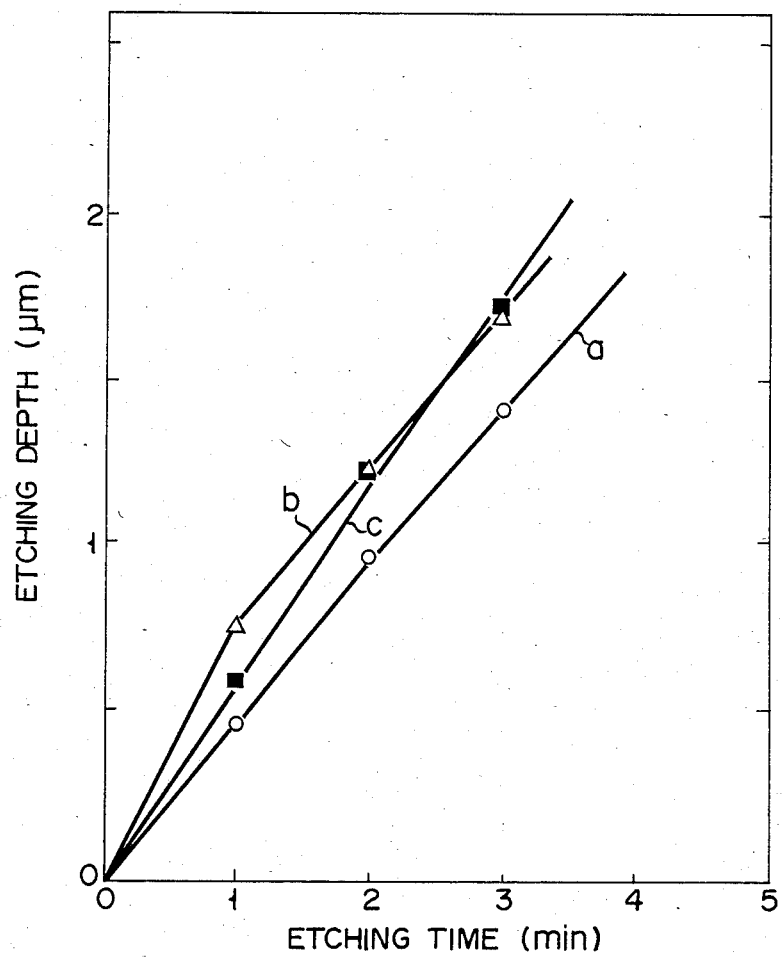
FIG. 4 is a graph showing the relationship between an etching time and an etching depth when a compound semiconductor is etched using dichlorodifluoromethane.

FIG. 4 shows the relationship between an etching time and an etching depth when a GaAs compound semiconductor is etched using dichlorodifluoromethane as a plasma-generating gas. A high-frequency electric power density was 0.42 W/cm$^2$. In FIG. 4, line a indicates the case wherein the gas flow was 10 SCCM and the pressure in the vacuum chamber was 0.04 Torr, line b indicates the case wherein a gas flow rate was 10 SCCM and pressure was 0.06 Torr, and line c indicates the case wherein the gas flow rate was 17 SCCM and the pressure was 0.06 Torr. As is apparent from FIG. 4, when dichlorodifluoromethane was used, linearity of the etching time and the etching rate became poor, resulting in a time lag before etching could be started. In addition, the variations in the etching rate suggest that a polymer is formed on the entire surface of the compound semiconductor.

Figure 5:
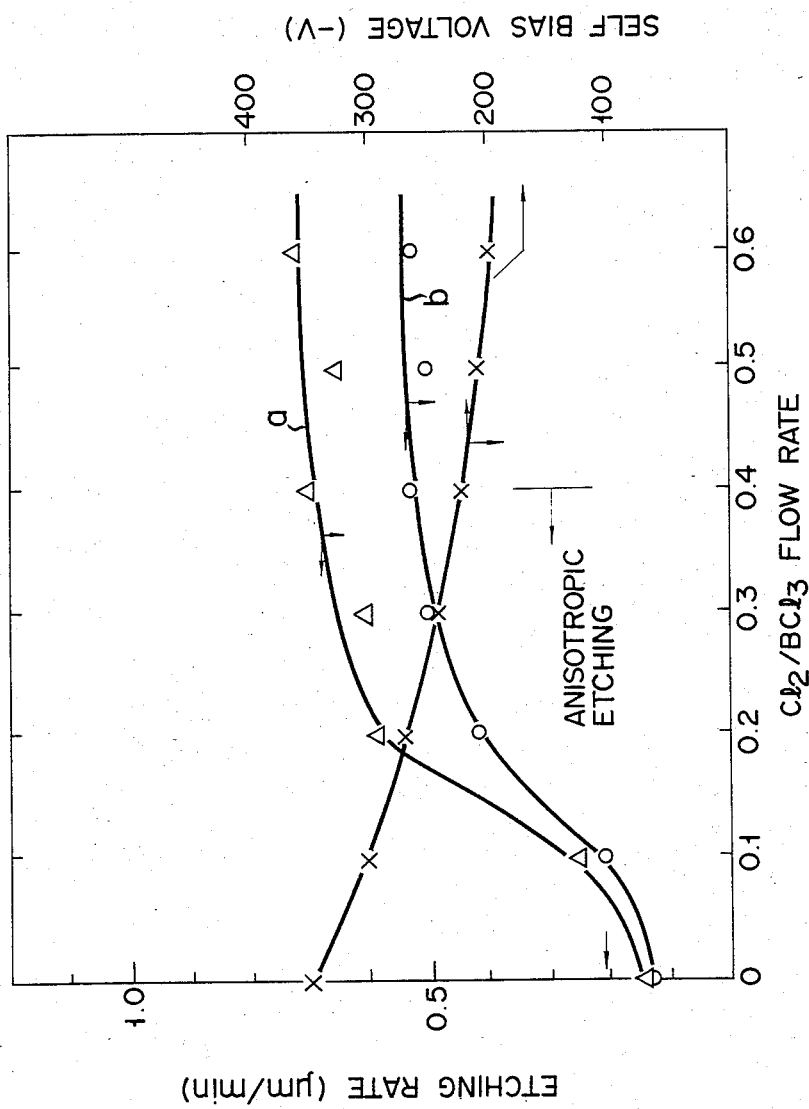
FIG. 5 is a graph showing the relationship between a flow rate ratio of $Cl_2$ and $BCl_3$ and an etching rate when a compound semiconductor is etched according to the mehtod of the present invention.

FIG. 5 shows the change in an etching rate when the flow rate of chlorine gas is changed under conditions wherein the high-frequency electric power density was 0.42 W/cm$^2$, the flow rate of BCl$_3$ in the vacuum chamber was 40 SCCM, and the total gas pressure was 0.06 Torr. Line a represents the result of the GaAs, and line b represents the result of the Ga$_{1-x}$Al$_x$As (x=0.45). Note that FIG. 4 also shows a self-biasing value at the cathode. As is apparent from FIG. 4, when the flow rate ratio of Cl$_2$ with respect to BCl$_3$ is 0.1 or more, an etching rate becomes practical. When this ratio exceeds about 0.4, anisotropic etching cannot be achieved.

FIG. 6 shows a relationship between a partial pressure ratio of Cl$_2$ to CCl$_4$ when a compound semiconductor was etched by using a mixture of Cl$_2$ and CCl$_4$. Conditions were as shown in FIG. 4. When the mixture of CCl$_4$ and Cl$_2$ was used, conditions for anisotropically etching GaAs and GaAlAs at substantially the same etching rate are limited to a partial pressure ratio of Cl$_2$ and CCl$_4$ of less than 0.2. Even if the etching conditions were varied by a small a mount, the etching rates of both the compound semiconductors became considerably different, resulting in these conditions being inconvenient for practical use.

Figure 7:
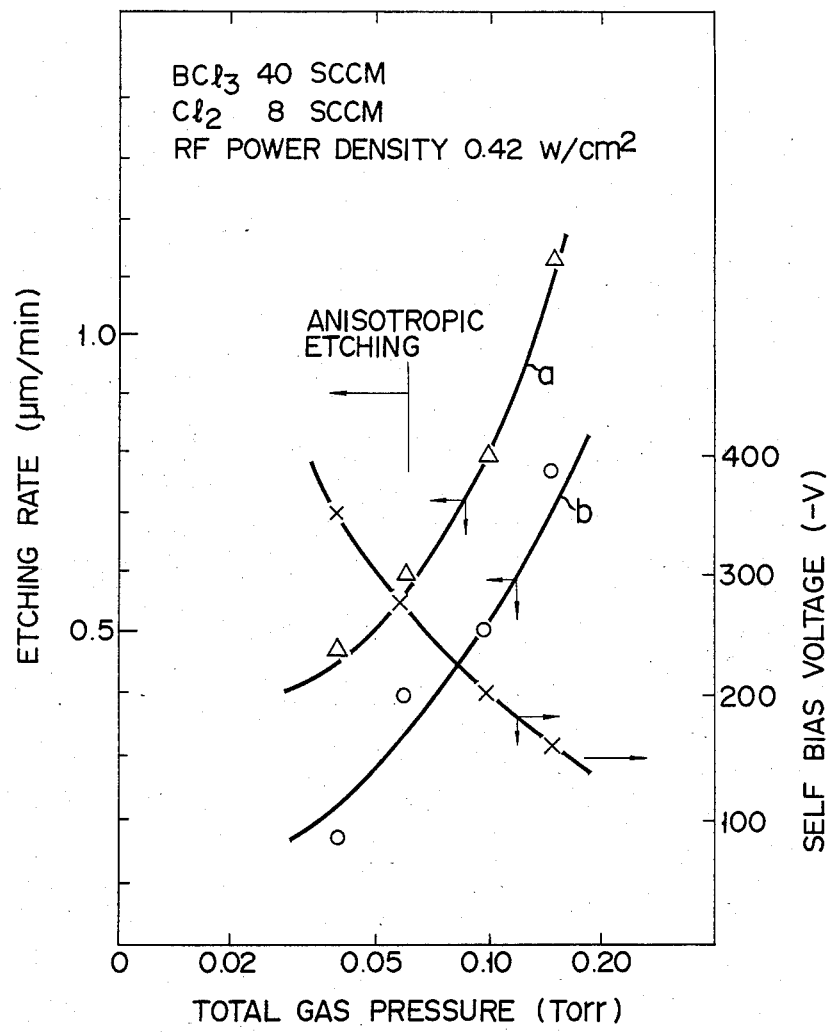
FIG. 7 is a graph showing the relationship between a total pressure of a plasma-generating gas and an etching rate when a compound semiconductor is etched according to the present invention.

FIG. 7 shows a change in an etching rate corresponding to a change in the total pressure of BCl$_3$ and Cl$_2$ under conditions wherein the high-frequency electric power density was 0.42 W/cm$^2$, the flow rate of the BCl$_3$ introduced into the vacuum chamber was 40 SCCM, and the flow rate of the Cl$_2$ introduced thereinto was 8 SCCM. Line a represents the case wherein GaAs was etched, and line b represents the case wherein Ga$_{x-1}$Al$_x$As (x=0.45) was etched. As is apparent from FIG. 7, the dry etching method of the present invention allows a wide range of a total gas pressures for etching a compound semiconductor. In addition, the gas pressure dependency of the etching rate of both GaAs and GaAlAs are substantially the same. Note that a total gas pressure for achieving anisotropic etching was 0.06 Torr or less.

Figure 8:
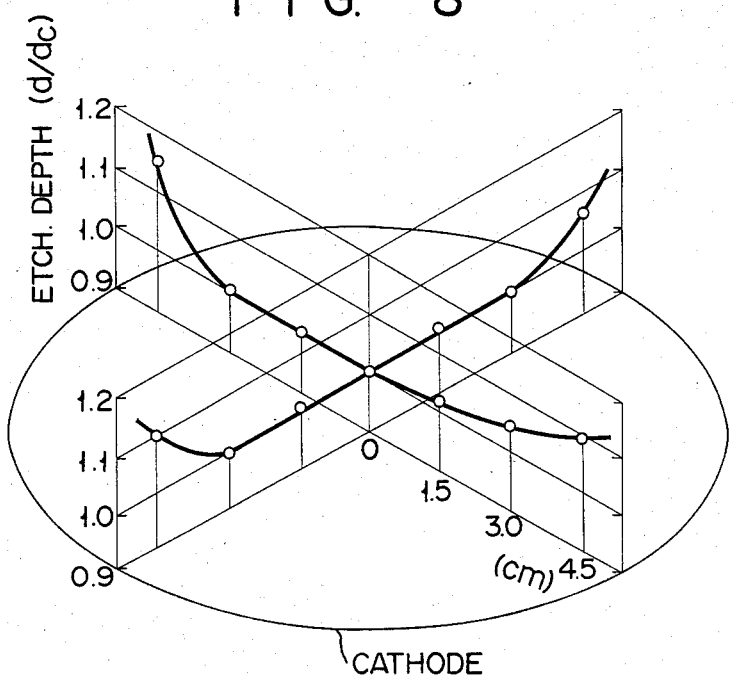
FIG. 8 is a representation showing the uniformity of etching when a compound semiconductor is etched according to the method of the present invention.

FIG. 8 shows a ratio of an etching depth with respect to the distance of a workpiece from the cathode center (i.e., etching depth/etching depth of the workpiece at the cathode center (1.38 μm) when a GaAs substrate (workpiece) arranged on the cathode having a diameter of 11 cm was etched. The GaAs substrate was etched under the conditions wherein the high-frequency electric power density was 0.42 W/cm$^2$, the introduction flow rate of the BCl$_3$ in the vacuum chamber was 8 SCCM, the total gas pressure was 0.06 Torr, the distance between the anode and the cathode was 6 cm, and the etching time was 2 minutes. The uniformity of the etching depth was ±5% on the entire surface of the cathode and was ±2% within 6 cm-regions from the cathode center. Therefore, considerably good etching uniformity can be obtained.

Figure 9:
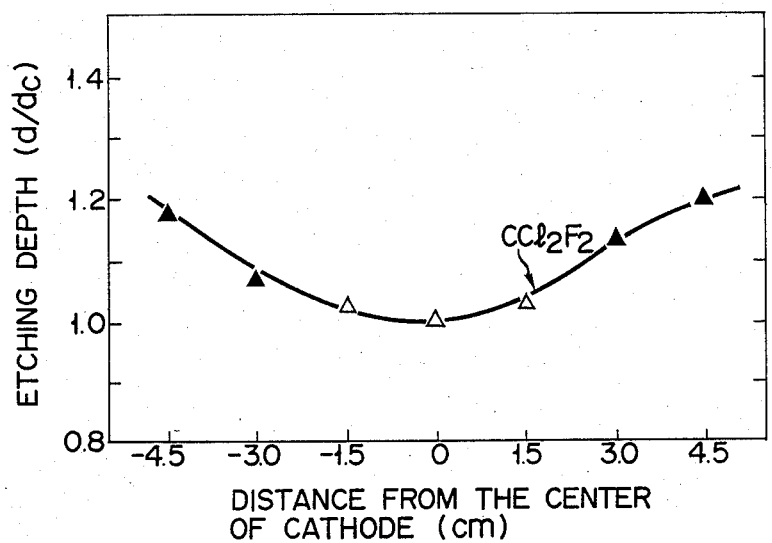
FIG. 9 is a graph showing the uniformity of etching when a compound semiconductor is etched using dichlorodifluoromethane.

For the purpose of comparison, FIG. 9 shows the resulting uniformity under the same conditions as those of FIG. 8 when dichlorodifluoromethane was used as a plasma-generating gas. When FIG. 8 is compared with FIG. 9, the dry etching method of the present invention using a mixture of BCl$_3$ and Cl$_2$ as a plasma-generating gas shows better uniformity than that using dichlorodifluoromethane as a plasma-generating gas. When dichlorodifluoromethane was used, an etching depth depended greatly upon the distance from the cathode center of the workpiece.

Figure 10:
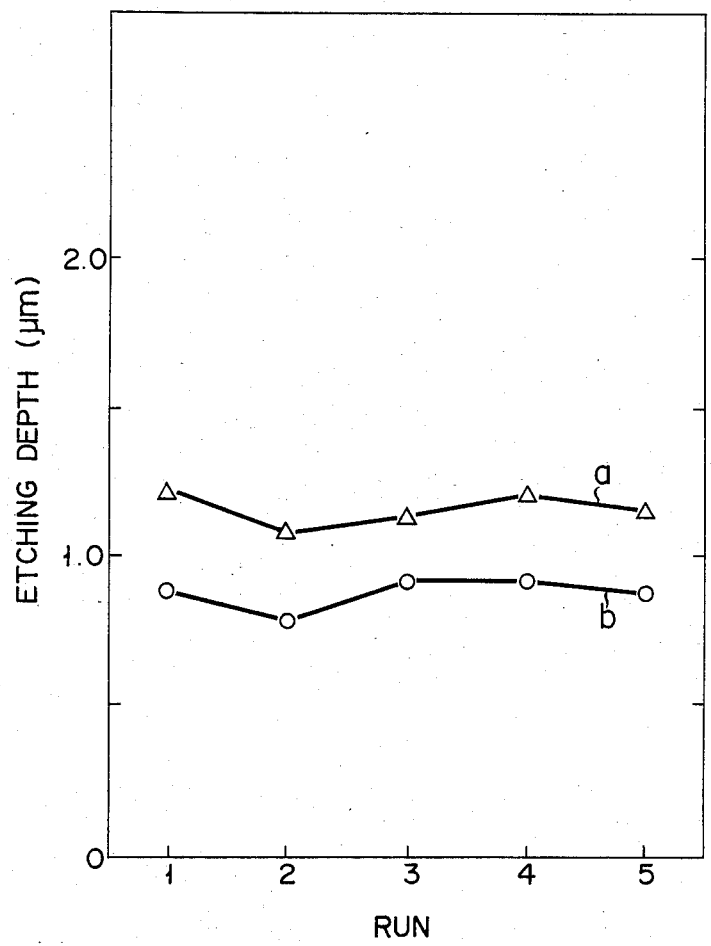
FIG. 10 is a graph showing the reproducibility when a compound semiconductor is etched according to the method of the present invention.

FIG. 10 shows the etching depth when GaAs and GaAlAs were respectively etched five times under conditions wherein the high-frequency electric power density was 0.42 W/cm$^2$, the flow rate of BCl$_3$ introduced into the vacuum chamber was 40 SCCM, that of Cl$_2$ was 8 SCCM, the total gas pressure in the vacuum chamber was 0.06 Torr, and the etching time was 2 minutes. Line a represents the result of GaAs and line b represents that of GaAlAs. The etching depth of GaAs was within 1.16±0.10 μm, and that of GaAsAl was within 0.88±0.09 μm. Therefore, very good reproducibility can be obtained.

Next, Table 1 shown below shows an etching rate (etching selectivity) of a compound semiconductor and a mask material when a compound semiconductor was selectively etched when masked by AZ-1350 (AZ positive-working photoresist available from Shiplay Company) or a silicon oxide film. For the purpose of comparison, the result using a gas mixture of CCl$_4$ and Cl$_2$ is also shown.

TABLE 1

| Mask material | BCl$_3$ + Cl$_2$(1) | | CCl$_4$ + Cl$_2$(2) | |
|---|---|---|---|---|
| | Material to be etched | | | |
| | GaAs | GaAlAs | GaAs | GaAlAs |
| AZ-1350 | 11 to 12 | 6 to 8 | 4.5 | 3.7 |
| S$_i$O$_2$ | 50 to 70 | 30 to 50 | 19 | 15 |

(Note) Etching conditions:
(1) BCl$_3$: 40 SCCM
Cl$_2$: 8 SCCM
Total gas pressure: 0.06 Torr
Rf power density: 0.42 W/cm$^2$ (2) CCl$_4$: 0.05 Torr
Cl$_2$: 0.02 Torr
Total gas pressure: 0.06 Torr
Rf power density: 0.45 W/cm$^2$ A plurality of GaAlAs layers are formed on a GaAs substrate so as to form a semiconductor laser, light-emitting diode, a photodiode or an integrated element thereof. In this case, the reactive ion etching method of the present invention can be effectively used. For example, in the case of a semiconductor laser, an end face of a resonator is conventionally formed by manual cleaving, and this process provides a considerably low productivity. However, when the reactive ion etching method of the present invention is used, a monolithic end face can be formed, thereby providing high productivity and high industrial value. Furthermore, in integrated elements including semiconductor lasers, the cleaving process cannot be adopted for forming the end face thereof. However, if the reactive ion etching method of the present invention is used, such integrated elements can easily be realized. On the other hand, the process for forming a mesa structure of a buried type laser or an inner stripe groove formed in a current blocking layer of an inner stripe type laser is important for lasing the laser in the transverser mode and for obtaining a beam which has high roundness. Currently, this process is performed by wet etching. However, it is difficult to control a 1 to 2 μm region by wet etching, resulting in poor reproducibility. In contrast, when formation of a mesa structure or groove is performed by using the reactive ion etching method of the present invention, control of a 1 to 2 μm region can be easily performed. In addition, since the method of the present invention is anisotropic etching, it can be effectively used to manufacture a device. Furthermore, the method of the present invention can be effectively adopted in a process for forming a substrate and a process for forming holes of a ballast type light emitting diode.

Figure 11A:
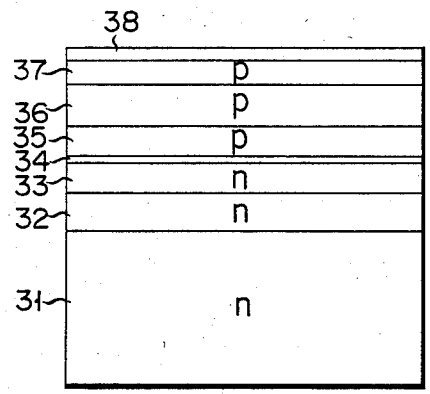
FIGS. 11A to 11D and 12 are respectively sectional views and a perspective view for explaining steps of manufacturing a semiconductor laser using a dry etching method of the present invention.
Figure 11B:
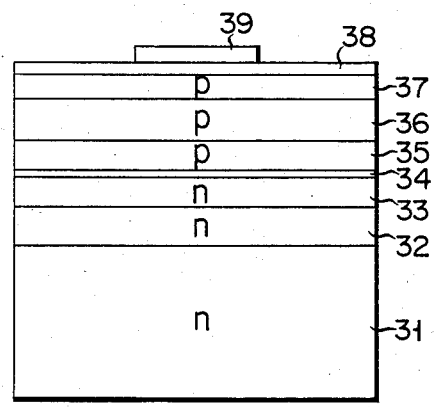
Figure 11C:
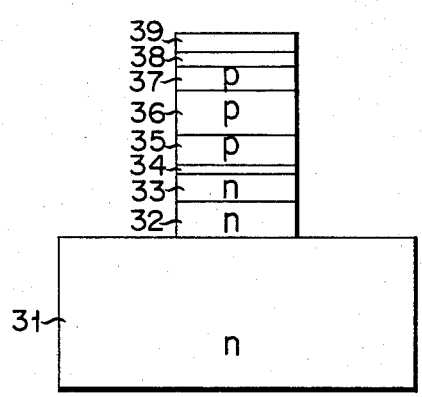

An example in which the dry etching method of the present invention is adopted for manufacturing a buried type semiconductor laser will now be described with reference to FIGS. 11A to 11D and 12. As shown in FIG. 11A, an n-type Ga$_{0.65}$Al$_{0.35}$As layer (cladding layer) 32, an n-type Ga$_{0.8}$Al$_{0.2}$As layer (optical guiding layer) 33, a Ga$_{0.95}$Al$_{0.05}$As layer (active layer) 34, a p-type Ga$_{0.8}$Al$_{0.2}$As layer (optical guiding layer) 35, a p-type Ga$_{0.65}$Al$_{0.35}$As layer (cladding layer) 36, a p-type GaAs layer 37 and a p-type Ga$_{0.4}$Al$_{0.6}$As layer 38 are sequentially stacked on an n-type GaAs substrate 31. The thickness of this multilayer on the substrate 31 is about 5 μm. Then, as shown in FIG. 11B, a resist film is coated on a surface of the thus formed GaAlAs multilayer. The resist film is patterned to form a stripe-shaped resist pattern 39. The GaAlAs multilayer is selectively etched using the resist pattern 39 as a mask and the parallel plate type dry etching apparatus shown in FIG. 1. In this case, etching is performed under conditions wherein a gas mixture of BCl$_3$ and Cl$_2$ having a volume ratio of Cl$_2$/BCl$_3$=20% is used, the etching pressure and the high-frequency electric power density are respectively controlled to be 0.06 Torr and 0.42 W/cm$^2$, thereby etching the GaAlAs multilayer down to the GaAs substrate 31, as shown in FIG. 11C.

Figure 11D:
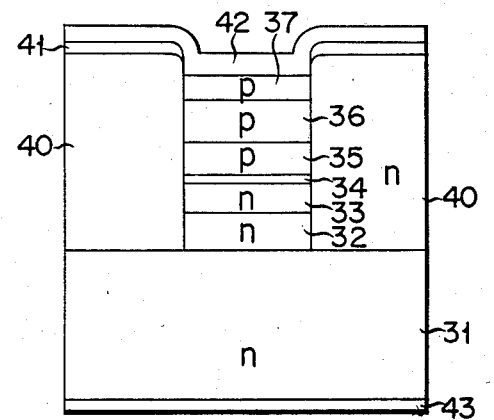

As shown in FIG. 11D, the resist pattern 39 is removed. Buried layers 40 are selectively formed on the substrate 31 using the p-type Ga$_{0.4}$Al$_{0.6}$As layer 38 as a selective crystal growth mask. Thereafter, the p-type Ga$_{0.4}$Al$_{0.6}$As layer 38 is removed. Insulation layers 41 are formed on the buried layers 40. Then, an electrode 42 is formed on the GaAs layer 37, and another electrode 43 is formed on a lower surface of the GaAs substrate 31 by vacuum deposition.

Figure 12:
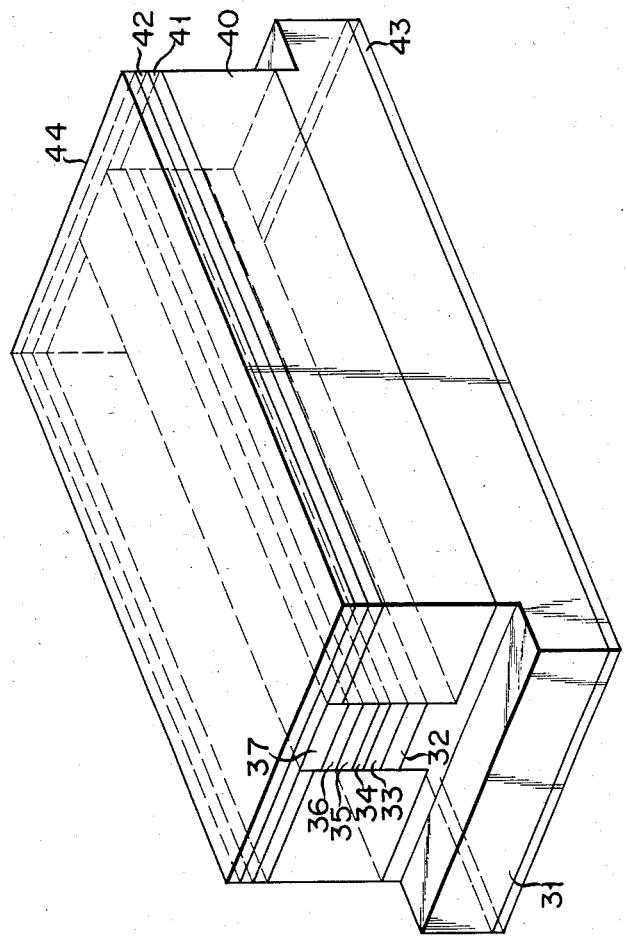

Then, as shown in FIG. 12, a photoresist mask 44 is formed on the electrode 42 so as to cover a portion of a mesa region and the buried layers 40 and to have an end thereof perpendicular to a mesa stripe. Thereafter, the electrode 42 is etched by reactive ion etching using a reactive gas mainly consisting of Cl$_2$. Subsequently, the GaAlAs multilayer and the buried layers 40 are etched down to the GaAs substrate 31 by using a gas mixture of BCl$_3$ and Cl$_2$ gases under the same conditions as described above. In this case, under the above conditions, since anisotropic etching is performed, an end face of the resonator can be formed, thereby forming a plurality of buried type semiconductor lasers on a single substrate in a monolithic manner.

According to the present invention, differences in etched shapes due to differences in a crystal mixture ratio of Al can be prevented. The side surface of the mesa structure and the end face of the resonator become flat, and no side etching occurs. Under the above conditions, the etching selection ratio of the resist, GaAs and GaAlAs are as shown in Table 1, and this etching selection ratio can be satisfactorily adopted in deep etching to about 5 μm.

Note that the present invention is not limited to the above embodiment. For example, if a compound semiconductor device includes Al as a component element, the compound semiconductor device is not limited to a semiconductor laser, but can be applied to other light-emitting elements, field effect transistors, and integrated circuits thereof. In this embodiment, although a crystal including GaAlAs is used as a material to be etched, a compound semiconductor including Al as a component element such as (AlGaIn)P, (GaAl)Sb and Cu(GaAl)Sb and allowing etching by a gas mixture of BCl$_3$ and Cl$_2$ gases can also be used. The etching conditions are not limited to those used in the embodiment. The etching conditions can be changed in accordance with the best conditions of a compound semiconductor as a material to be etched. Furthermore, various changes and modifications are deemed to lie within the spirit and scope of the present invention.

As described above, according to the present invention, a compound semiconductor including Al as a component element can be anisotropically etched by reactive ion etching to a depth of about 5 μm with a practical etching rate. In this case, the etching rate and the reproducibility of the etching shape are considerable, and no polymer is formed on an etched surface. Furthermore, a selection ratio with respect to a mask is greatly increased over that of a conventional method. Therefore, when this etching process is introduced into a manufacturing process of a compound semiconductor device, the productivity, reproducibility and ease of circuit design are satisfactorily improved over those of a conventional wet etching or dry etching method, and so the industrial value thereof is considerable.

What is claimed is:

1. A method for preparing a semiconductor light-emitting device including a semiconductor laser and a light-emitting diode, by reactive ion etching of a compound semiconductor comprising the steps of:
   (a) introducing a plasma-generating gas comprising boron trichloride and chlorine into a plasma generation region which is defined between a cathode supporting a workpiece comprising a Group III–V compound semiconductor containing an element which may be readily oxidized and an anode opposite thereto;
   (b) applying high-frequency electric power between said cathode and said anode, thereby generating a plasma from said plasma-generating gas; and
   (c) etching said compound semiconductor with said plasma according to reactive ion etching, so as to prepare a light-emitting semiconductor device.

2. The method according to claim 1, wherein a total gas pressure of the boron trichloride and the chlorine which are introduced in said plasma generation region is not more than 0.15 Torr.

3. The method according to claim 1, wherein a ratio of the chlorine included in said plasma gas is not more than 40% by volume.

4. The method according to claim 1, wherein the high-frequency electric power has a density of 0.1 W/cm$^2$ to 1 W/cm$^2$.

5. The method according to claim 1, wherein said compound semiconductor is GaAlAs.

6. The method according to claim 1, wherein said compound semiconductor is formed on a GaAs substrate and is a multilayer having a plurality of GaAlAs layers respectively having different contents of aluminum.

7. The method according to claim 1, wherein the total gas pressure of said boron trichloride and said chlorine which are introduced into said plasma generation region is 0.04 to 0.08 Torr.

8. The method according to claim 1, further comprising evacuating said plasma generation region to a pressure of 0.000006 Torr or less before introducing said plasma-generating gas.

9. The method according to claim 7, wherein said element contained in said compound semiconductor is aluminum.

10. The method according to claim 9, wherein said compound semiconductor is GaAlAs, GaAlAsP or InAlGaP.

11. A method for preparing a semiconductor light-emitting device including a semiconductor laser and a light-emitting diode, by reactive ion etching of a compound semiconductor comprising the steps of:
    (a) introducing a plasma-generating gas comprising boron trichloride and chlorine into a plasma generation region which is defined between a cathode supporting a workpiece comprising a group III–V compound semiconductor containing aluminum and an anode opposite thereto;
    (b) applying high-frequency electric power between said cathode and said anode, thereby generating a plasma from said plasma-generating gas; and
    (c) etching said compound semiconductor with said plasma according to reactive ion etching, so as to prepare a light-emitting semiconductor device.

12. The method according to claim 11, wherein said compound semiconductor has a multi-layered structure of GaAs layers respectively having different contents of Al.

13. The method according to claim 12, wherein said multi-layered structure is formed on a GaAs substrate.

* * * * *